United States Patent [19]

Bewick et al.

[11] Patent Number: 5,381,377
[45] Date of Patent: Jan. 10, 1995

[54] WORD LINE DRIVER CIRCUIT AND METHOD

[75] Inventors: Gary W. Bewick, Palo Alto; Mark R. Santoro; Lee S. Tavrow, both of Sunnyvale, all of Calif.

[73] Assignee: Sun Microsystems, Inc., Mountain View, Calif.

[21] Appl. No.: 131,058

[22] Filed: Sep. 27, 1993

Related U.S. Application Data

[63] Continuation-in-part of Ser. No. 91,948, Jul. 15, 1993, which is a continuation-in-part of Ser. No. 960,616, Oct. 14, 1992.

[51] Int. Cl.[6] .............................................. G11C 11/40
[52] U.S. Cl. ........................... 365/230.06; 365/189.06; 326/89; 326/105
[58] Field of Search ................ 307/445, 449, 463, 467; 365/230.06, 189.06

[56] References Cited

U.S. PATENT DOCUMENTS 4,706,222 11/1987 Kwiatkowski et al. ............. 307/463

OTHER PUBLICATIONS

"A 3.5 ns, 2 W, 20 mm² 16 Kb ECL Bipolar RAM" by K. Yamaguchi et al. 1986 IEEE International Solid-State Circuits Conf., pp. 214–215.
"A 23 ps/2.1 mW ECL Gate" by K. Toh et al., 1989 IEEE International Solid-State Circuits Conference, pp. 224–225.
"High Speed Low-Power Charge-Buffered Active Pull-Down ECL Circuit", by C. Chuang et al., Journal of Solid-State Circuits, May 1991.
"A 4-ns 4K X 1-bit Two-Port BiCMOS SRAM" by T. Yang et al., IEEE Journal of Solid-State Circuits, vol. 23, No. 5, Oct. 1988.

Primary Examiner—Eugene R. LaRoche
Assistant Examiner—F. Niranjan
Attorney, Agent, or Firm—James W. Rose

[57] ABSTRACT

A driver circuit for use in a semiconductor memory array is disclosed. The memory array includes a plurality of the driver circuits, each used to drive a word line in the memory array. The driver circuit of the present invention includes a pull up portion and an active pull down portion. The pull up portion includes a pair of cascaded transistors arranged to pull up an output node coupled to the word line. The active pull down portion includes a pair of cascaded transistors arranged to pull down the output node coupled to the word line. A control feedback path is coupled between the output node and the active pull down portion of the driver circuit. The feedback path controls the activation of the pull down portion of the driver circuit.

23 Claims, 2 Drawing Sheets

WORD LINE DRIVER CIRCUIT AND METHOD

CROSS REFERENCE TO RELATED APPLICATIONS

This is a continuation-in-part application U.S. patent application Ser. No. 08/091,948 entitled "Word Line Decoder/Driver Circuit and Method", filed Jul. 15, 1993, which is a continuation-in-part application of pending U.S. patent application Ser. No. 07/960,616, entitled "Random Access Memory Design", filed Oct. 14, 1992.

BACKGROUND OF THE INVENTION

1. Field of the Invention

The present invention relates to semiconductor memories, and more particularly, to a high speed, low power, word line driver circuit.

2. Description of the Prior Art

In a semiconductor memory array with ($2^n$) word lines, an address input of (n) bits is required to select one of the word lines. Each word line in the array includes a decoder circuit and a driver circuit. All of the decoder circuits receive and decipher the (n) bit address input, and in response thereto, one word line in the array is selected. The driver circuit of the selected word line drives the selected word line, thus allowing a memory cell or cells on the selected word line to be accessed. All the other word lines in the array are deselected.

For certain applications such as cache memory on a microprocessor chip, fast memory cycle times and low power consumption are desired. A memory cycle is the time between successive operations, i.e., a read or write. The rise time, recovery time, and power consumption of a driver circuit are all critical to the overall performance of the memory.

A prior art word line driver circuit is described in the article entitled "An Experimental Soft-Error Immune 64-Kb 3ns Bipolar Ram", Kunihiko Yamaguchi et al., IEEE Bipolar Circuits and Technology Meeting, 1988. This article describes a two-cascaded transistor driver circuit (FIG. 3) which pulls up a selected word line in response to a word line select signal. A first discharge circuit is coupled at an intermediate node between the two cascaded transistors. A second discharge circuit is coupled to the output node which drives the word line. Each discharge circuit includes a pair of cascaded transistors, a capacitor, and a pair of resistors. This driver circuit has several disadvantages. First, the two discharge circuits each include a constant current source which dissipates power, regardless of whether the word line is selected or deselected. Accordingly, the size of the memory array is limited for a given power budget. Second, the discharge circuit is active when the row is selected, which slows down the pull up time of the driver. Third, the capacitor and resistors of each discharge circuit create an RC constant which determines the time period in which the discharge circuit remains on. This RC time constant may differ between wafer runs due to process variations. The discharge circuit is therefore process sensitive and very difficult to manufacture so that the timing of the discharge circuit coincides with that of the memory cycle.

Another prior art driver circuit is described in an article entitled "A 4-ns 4K×1-bit Two-Port BiCMOS SRAM", by Yang et al., IEEE Journal of Solid-State Circuits, Vol. No. 5, 1988. This article describes a two-stage Darlington driver circuit (FIG. 8) for each word line. A common pull down current source is coupled to the output of each driver circuit through a resistor. The shared current source reduces power consumption, but at the expense of the operational speed of the circuit. When all the word lines are deselected, the constant current source is equally shared among all the driver circuits. When a word line is selected, the selected driver circuit draws more current than the inactive drivers. The rise time of the selected word line is slowed because as the driver raises the word line, the driver must supply more current to the resistor, so less current is actually available to drive the word line. The recovery time of the selected word line is very slow because the pull down resistor and the word line capacitance creates an RC delay during pull down. Furthermore, if there is an overlap between a word line being selected and another word line being deselected, which is a common occurrence in a SRAM, the recovery time of the deselected word line is further increased because the newly selected word line driver "steals" away much of the current that the deselected word line driver would otherwise be using to pull down the newly deselected word line.

Yet another driver circuit is described in an article entitled "High Speed Low-Power Charge-Buffered Active Pull Down ECL Circuit", by C. T. Chuang et al., IEEE, 1991. This article describes a driver with an active pull down circuit (FIG. 1b). The driver is coupled between the NOR side of an ECL differential pair decoder and the word line. The active pull down circuit includes a capacitor coupled to the OR side of the ECL differential decoder and a pull down transistor. During word line recovery, the capacitor is discharged through the pull down transistor as current is switched through the OR side of the differential pair. As a result, the pull down transistor is turned on, providing an active pull down path between the word line and ground. In time, the charge on the capacitor discharges and the pull down transistor turns off. This active pull down circuit also has several disadvantages. Since the gain (beta) of the pull down transistor may vary from wafer run to wafer run during fabrication, it is difficult to determine the correct size of the capacitor. If the gain of the pull down transistor does not match the size of the capacitor, the pull down transistor may not turn on hard enough or may turn off very slowly, which needlessly consumes power. The capacitor also tends to be very large and occupies valuable space on the semiconductor die.

SUMMARY OF THE INVENTION

The present invention discloses a word line driver circuit for a memory array. The driver circuit includes a number of novel features that provide superior speed performance and reduced power consumption, not possible with prior art driver circuits. In the preferred embodiment of the present invention, a plurality of the driver circuits are used in the memory array, each used to drive a word line. All the driver circuits in the memory array share a single common pull down current source.

The driver circuit of the present invention includes a pull up portion and an active pull down portion. The pull up portion includes a pair of cascaded transistors arranged to pull up an output node coupled to the word line. The active pull down portion includes a pair of cascaded transistors arranged to pull down the output node coupled to the word line. A control feedback path is coupled between the output node and the active pull down portion of the driver circuit and is used to control the activation of the pull down portion of the driver circuit.

The driver circuit of the present invention has three states of operation: the deactivated state; the driving state; and the recovery state. In the deactivated state, the pull up portion of the driver circuit is inactive and the corresponding word line is deselected. Since all the driver circuits are identical, the shared current source is divided equally among all of the driver circuits in the memory array. In the driving state, the pull up portion of a selected driver circuit is activated and the corresponding selected word line is pulled up. The control feedback path prevents the activation of the active pull down portion of the selected driver circuit. In the recovery state, the word line decoder deactivates the pull up portion of the selected driver circuit after an appropriate access time. Thereafter, the control feedback path activates the pull down portion of the driver circuit. As a result, the transistors of the active pull down portion are turned on and the output node is pulled down. After the output node is pulled down, the active pull down portion is self-terminating, and the selected driver circuit returns to the deactivated state in anticipation of the next memory cycle.

The driver circuit of the present invention provides many advantages. The rise time of the driver circuit is very fast because the active pull down circuit is off during pull up of the word line. The recovery time of the driver circuit is also very fast because the pull up portion is deactivated while the active pull down portion pulls the word line down. Since a single pull down current source is shared among all the drivers in the memory array, the driver circuit consumes very little power. Lastly, the driver circuit is highly manufacturable because the pull up portion and the active pull down portion are matched. The only requirement for proper design and operation of the driver circuit of the present invention is standard ECL matching between identical components. In contrast, the prior art driver circuits with RC constants are far more process sensitive, and hence less manufacturable, because of the timing problems associated with the active pull down portion of the circuit.

DESCRIPTION OF THE DRAWINGS

The objects, features and advantages of the present invention will be apparent from the following description in which.

DESCRIPTION OF THE PREFERRED EMBODIMENT

Figure 1:
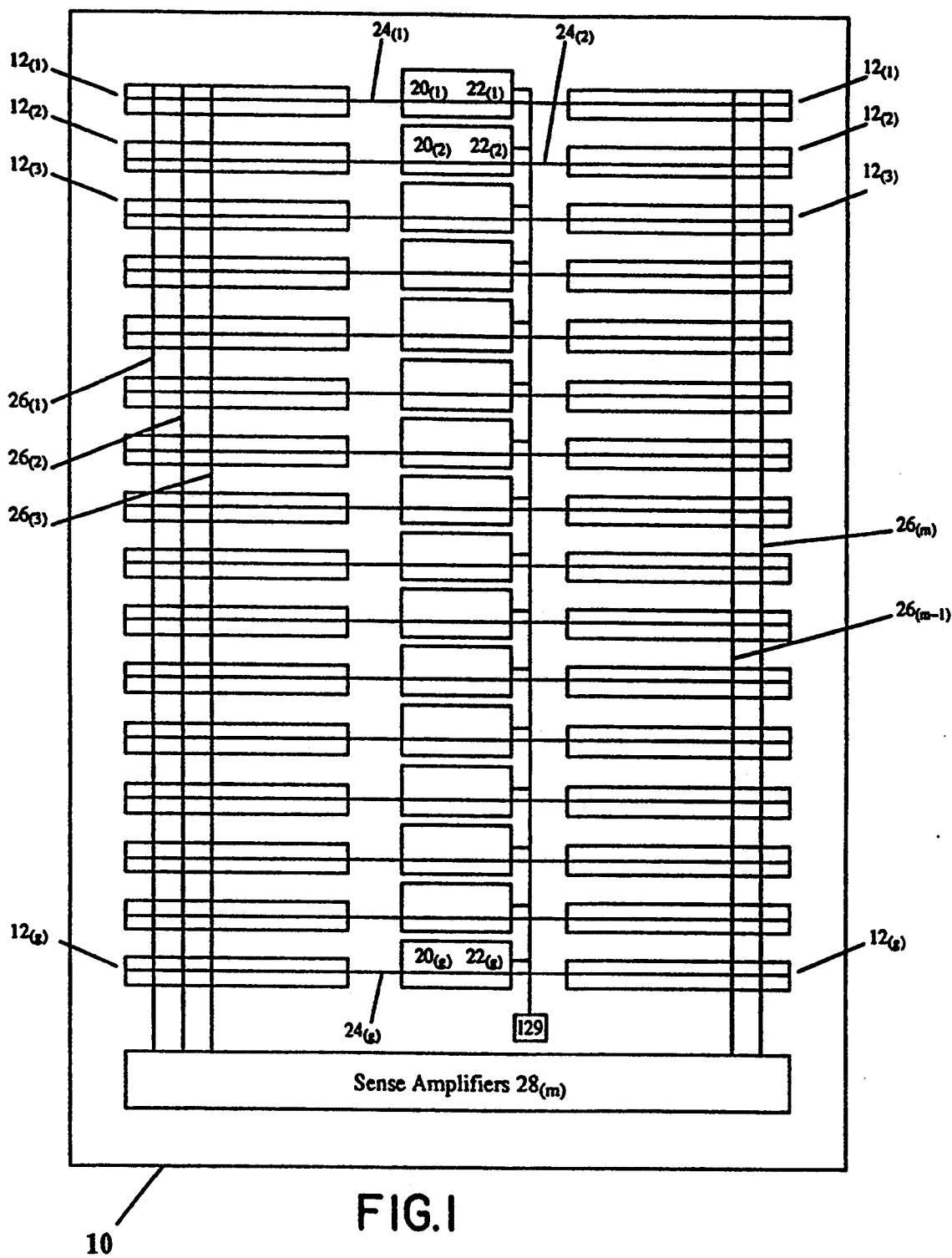
FIG. 1 illustrates a logic block diagram of an Embedded Access Tree (EAT) memory array of the present invention.

Referring to FIG. 1, a logic block diagram of an Embedded Access Tree (EAT) memory array 10 is shown. The purpose of this figure is to illustrate the logical relationship between the various elements of the EAT memory array 10 described with respect to the present invention and is not necessarily intended to show the actual layout of the elements on a semiconductor die.

Of particular relevance to the present invention are global word line (GWL) decoders $20_{(1-g)}$, GWL drivers $22_{(1-g)}$, GWLs $24_{(1-g)}$, bit lines $26_{(1-m)}$, global sense amplifiers $28_{(1-m)}$ and single common pull down current source I29. GWL decoders $20_{(1-g)}$ and GWL drivers $22_{(1-g)}$ are associated with each subarray $12_{(1-g)}$ respectively. Each subarray 12 includes (l) local word lines (not shown). The total number ($2^n$) of rows in the EAT memory is equal to the number of subarrays 12 multiplied by the number of local rows per subarray ($2^n = g \times l$). The bit lines $26_{(1-m)}$ couple the (m) columns of memory cells to global sense amplifiers $28_{(1-m)}$ respectively.

In accordance with describing the best mode of operation of the present invention, the GWL driver 22 of the present invention is used to drive the Embedded Sense Amplifiers (ESA) in the EAT memory disclosed in detail in the aforementioned parent application entitled "Random Access Memory Design", incorporated by reference herein. This EAT memory is an 8K byte SRAM array intended for use as a first level cache on a semiconductor die containing a microprocessor unit. The EAT array includes two hundred and fifty-six (m=256) columns and two hundred and fifty-six ($2^n$=256) rows of memory cells. In the particular embodiment described in the parent application, the rows are grouped together in sixteen subarrays (g=16). Each subarray includes sixteen local rows (l=16) of memory cells. The common pull down current source I29 is approximately 24.6 mA in the aforementioned EAT memory array.

The various elements of the EAT memory array 10 of the present invention can be laid out on a semiconductor die in a number of arrangements. For example, the actual layout of the EAT memory 10 can be the same as that described and illustrated in FIG. 3 and FIG. 5 of the aforementioned parent application. In particular, several subarrays can be laid out on the die so that they can be muxed together and the global bit lines can be shared.

GLOBAL WORD LINE DECODER & DRIVER CIRCUIT

Figure 2:
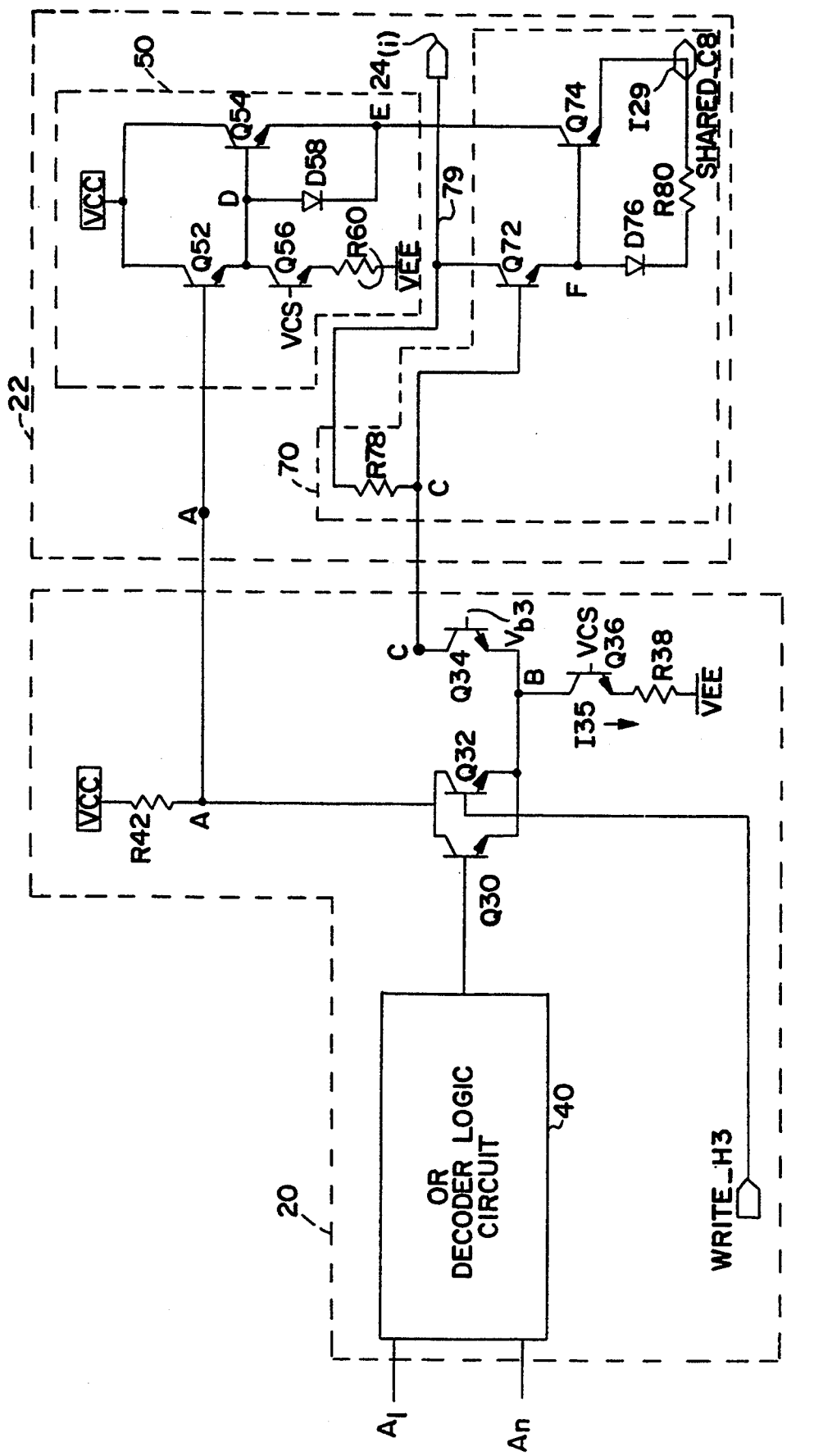
FIG. 2 illustrates a circuit schematic of a word line driver circuit according to the present invention.

Referring to FIG. 2, a schematic of the GWL decoder 20 and GWL driver 22 is shown. Both of these circuits are described in detail below.

Global Word Line Decoder

The GWL decoder 20 includes transistors Q30, Q32, and Q34 arranged in an emitter coupled logic (ECL) differential configuration, transistor Q36 and resistor R38 which form a constant differential current source I35 for the differential configuration, a standard OR decoder logic circuit 40, and pull up resistor R42. The base of Q30 is coupled to the output of the OR decoder logic circuit 40, the collector is coupled to node A, and the emitter is connected to node B. The base of Q32 is coupled to a "write" disable input, the collector is coupled to node A, and the emitter is coupled to node B. The base of Q34 is coupled to a reference voltage Vb3, the collector is coupled to node C, and the emitter is coupled to node B. The base of Q36 is coupled to a reference voltage Vcs, the collector is coupled to node B, and the emitter is coupled to Found through resistor R38. The OR decoder logic circuit 40 is coupled to receive address inputs $A_1$-$A_n$ from the address registers (not shown) of the EAT memory 10. Node A is coupled to Vcc through pull up resistor R42.

Global Word Line Driver

The GWL driver 22 includes a pull up portion 50 and an active pull down portion 70. The GWL driver 22 is coupled to and drives one of the GWLs $24_{(i)}$.

The pull up portion 50 includes transistors Q52, Q54 and Q56, diode D58, and resistor R60. The base of Q52 is coupled to node A, the collector is coupled to Vcc, and the emitter is coupled to node D. The base of Q54 is coupled to node D, the collector is coupled to Vcc, and the emitter is connected to output node E. The base of Q56 is coupled to Vcs, the collector is coupled to node D, and the emitter is connected to Vee through R60. The GWL $24_{(i)}$ is coupled to output node E.

The active pull down portion 70 of GWL driver 22 includes transistors Q72 and Q74, diode D76, resistors R78 and R80, and shared pull down current source I29. The base of Q72 is coupled to node C, the collector is coupled to output node E, and the emitter is connected to node F. The base of Q74 is coupled to node F, the collector is coupled to output node E, and the emitter is coupled to constant current source I29. Diode D76 and resistor R80 are coupled in series between node F and the constant current source I29. Resistor R78 is coupled between node C and output node E. The coupling of resistor R78 between output node E and node C provides a control feedback path 79 which controls the activation of the pull down portion 70 depending on the state of the driver circuit 22. The pull down current source I29 is shared among the active pull down portion 70 of all the subarrays $12_{(1-g)}$ of the EAT memory 10.

In accordance with describing the best mode of the present invention, the relative sizes of the transistors, diodes and resistor values of the GWL driver circuit 22 are provided in the table below.

| Transistor/Diode | Size | Resistor | Ohms |
| --- | --- | --- | --- |
| Q56 and D76 | minimum size (X) | R38 | 1250 |
| Q30, Q32 and Q34 | X | R42 | 1900 |
| Q36, Q72 and D58 | 2X | R60 | 5000 |
|  |  | R78 | 1200 |
| Q52 | 4X | R80 | 400 |
| Q54 | 40X |  |  |
| Q76 | 10X |  |  |

Operation

The GWL decoder 20 and GWL driver 22 have three states of operation: the deactivated state; the driving state; and the recovery state. The GWL decoder 20 and GWL driver 22 operate in a novel manner in each state, which greatly enhances the speed and power performance of the EAT memory 10.

In the deactivated state, the GWL $24_{(i)}$ is deselected because one or more of the address inputs $A_1-A_n$ applied to the input of OR gate decoder logic $40_{(i)}$ is high. As a result, the output of the OR decoder logic circuit $40_{(i)}$ is high and transistor Q30 is turned on. The differential current I35 is thus steered through Q30 of the differential configuration, and node A is pulled down. Since node A is low, Q52 and Q54 of the pull up portion 50 are not driven and output node E remains low and GWL $24_{(i)}$ is deselected. Furthermore, node C remains low because it is coupled to node E through resistor R78 of the control feedback path 79. As a result, transistors Q72 and Q74 are not activated.

In the deactivated state, the GWL driver 22 dissipates minimal power. For each driver circuit 22, Q52 and Q54 of the pull up portion 50 and Q72 and Q74 of the active pull down portion 70 are on just enough so that all of the GWL drivers $22_{(1-g)}$ dissipate an approximately equal share of the current source I29.

In the driving state, the address inputs $A_1-A_n$ for a particular GWL $24_{(i)}$ are all low and the output of the OR decoder logic circuit $40_{(i)}$ transitions low. As a result, Q30 is turned off and the differential current I35 is steered through Q34 of the differential configuration. Node C is thus pulled down and node A is pulled up by resistor R42. In the pull up portion 50 of the GWL driver circuit 22, Q52 and Q54 are turned on hard, pulling up node D and the output node E respectively. The GWL $24_{(i)}$ is pulled up and thus selected. The majority of the current used to drive the selected row $24_{(i)}$ is derived from Vcc.

In the driving state, the control feedback path 79 maintains the active pull down portion 70 inactive. This is accomplished by the voltage drop across resistor R78 between output node E and node C, due to the current flow from the differential current source I35, through Q34, node C, R78 and finally output node E. Thus, the potential at node C remains low and pull down transistors Q72 and Q74 remain inactive.

In the preferred embodiment, resistor R78 is sufficiently large to keep the potential at node C below the turn on threshold of Q72 and Q74. Otherwise, node C would be pulled up, Q72 and Q74 would be turned on, countering the pull up effect of node E by the pull up portion 50.

In the recovery state, the activated OR decoder logic circuit $40_{(i)}$ transitions high after the appropriate read time has elapsed. The differential current I35 is thus steered through Q30, node A is pulled down, and Q52 and Q54 of the pull up portion 50 are deactivated. Output node E, however, remains high until its potential is discharged. As a consequence, node C rapidly rises to the potential of node E because the differential current I35 is no longer flowing through resistor R78 since Q34 has been switched off. Accordingly, the potential at node C of the newly deactivated GWL driver $22_{(i)}$ is much higher than that of all the other deactivated GWL drivers 22. This causes transistors Q72 and Q74 of the activated GWL driver $22_{(i)}$ to turn on very hard, and most of the current from shared current source I29 flows through these two transistors. Output node E is thus rapidly pulled down, reducing the recovery time of the GWL driver $22_{(i)}$.

The GWL decoder $22_{(i)}$ is automatically returned to the deactivated state when the potential at output node E is discharged through the active pull down path 79. Node C, which tracks the potential of node E, in the recovery state is also discharged. This causes Q72 and Q74 to eventually turn off, meaning the active pull down portion 70 is self-terminating and the GWL driver $22_{(i)}$ returns to the deactivated state.

The GWL driver $22_{(i)}$ is deactivated by the write disable signal coupled to the base of Q32 of the differential configuration. During a write operation, the write disable signal is driven high, turning on Q32. As a result, node A is pulled down and the GWL driver $22_{(i)}$ is deactivated.

The diode D58 reduces tinging in the pull up portion 50 when the GWL driver $22_{(i)}$ is activated. The diode D76 and resistor R80 reduces tinging in the active pull down portion 70 when the GWL driver $22_{(i)}$ is in the recovery state. This advantage is fully described in the above-mentioned continuation-in-pan application entitled "Word Line Decoder/Driver Circuit and Method" incorporated by reference herein.

In accordance with a simplified embodiment of the present invention, many of the components in the pull up portion 50 and the active pull up portion 70 may be removed. For example, transistors Q52 and Q56, diode D58, and resistor R60 are removed from the pull up portion 50 and the base of Q54 is directly coupled to node A. Similarly, in the active pulled down portion 70, transistor Q72, diode D76 and resistor R80 are also removed and node C is coupled to the base of Q74. The operation of this embodiment is essentially the same as that described above, but offers the advantage of fewer elements and less die space.

While the present invention has been described in relationship to the embodiments described in the accompanying specification, other alternatives, embodiments, and modifications will be apparent to those skilled in the art. For example, the decoder 20 and driver circuit 22 could be used for any application where one of several items needs to be selected and driven. It is intended that the specification be only exemplary, and the true scope and spirit of the invention be indicated by the following claims.

What is claimed is:

1. A word line driver circuit, comprising:
    an output node coupled to a word line;
    a pull up portion for driving the output node and the line;
    an active pull down portion for pulling down the output node and word line; and
    a feedback control element, coupled between the output node and the active pull down portion, for controlling the activation of the active pull down portion of the word line driver circuit.

2. The circuit of claim 1, wherein the feedback control element comprises a voltage drop element between the output node and the active pull down portion.

3. The circuit of claim 2, wherein the voltage drop element comprises a resistance.

4. The circuit of claim 1, wherein the pull up portion comprises a pull up transistor.

5. The circuit of claim 1, wherein the pull up portion comprises cascaded transistors.

6. The circuit of claim 1, wherein the pull down portion comprises a pull down transistor.

7. The circuit of claim 1, wherein the active pull down portion comprises cascaded transistors.

8. The circuit of claim 1, wherein the feedback control element controls the active pull down portion in response to a state of the driver circuit.

9. The circuit of claim 8, wherein the feedback control element deactivates the active pull down portion when the driver is in a deactivated state.

10. The circuit of claim 8, wherein the feedback control element deactivates the active pull down portion when the driver is in an active state.

11. The circuit of claim 8, wherein the feedback control element activates the active pull down portion when the driver is in a recovery state.

12. The circuit of claim 11, wherein the feedback control element terminates the activation of the pull down portion after the recovery state.

13. The circuit of claim 1, wherein the pull up portion and the active pull down portion are matched.

14. A method of providing a word line driver circuit capable of operating in a driving state, and an active pull down state, comprising the steps of:
    providing a word line coupled to an output node;
    providing a pull up circuit coupled to the output node;
    providing a pull down circuit coupled to the output node;
    providing a control feedback element coupled between the output node and the pull down circuit for controlling the activation of the pull down circuit based on the state of the driver circuit.

15. The method of claim 14, wherein the provided control feedback element is further for deactivating the pull down circuit if the driver circuit is in the driving state.

16. The method of claim 14, wherein the provided control feedback element is further for maintaining a potential difference between the output node and the pull down circuit in the driving state so that the pull down circuit is not activated.

17. The method of claim 14, wherein the provided control feedback element is further for activating the pull down circuit after the driving state.

18. The method of claim 17, wherein the provided pull down circuit is self-terminating after being activated.

19. A semiconductor memory including a plurality of word lines, comprising:
    a plurality of word lines;
    a plurality of driver circuits associated with the plurality of word lines respectively;
    a common current source shared among the plurality of driver circuits; and
    wherein each of the driver circuits comprises:
        an output node coupled to its respective word line;
        a pull up portion for driving the output node;
        an active pull down portion for pulling down the output node; and
        a feedback control element, coupled between the output node and the active pull down portion, for controlling the activation of the active pull down portion of the word line driver circuit.

20. A method of operating a word line driver circuit having a word line coupled to an output node and a pull up circuit coupled to the output node, comprising the steps of:
    controlling a pull down circuit through a control feedback element based on the state of the driver circuit.

21. The method of claim 20, further comprising the step of deactivating the pull down circuit when the driver circuit is active.

22. The method of claim 20, further comprising the step of activating the pull down circuit after the driver circuit has been deselected.

23. The method of claim 22, wherein the pull down circuit terminates after being activated.

* * * * *

UNITED STATES PATENT AND TRADEMARK OFFICE
CERTIFICATE OF CORRECTION

PATENT NO. : 5,381,377
DATED : January 10, 1995
INVENTOR(S) : Bewick et al.

It is certified that error appears in the above-identified patent and that said Letters Patent is hereby corrected as shown below:

In column 7, claim 1 at line 31, before "line", insert -- word --.

Signed and Sealed this

Second Day of February, 1999

Attest:

Attesting Officer

*Acting Commissioner of Patents and Trademarks*